ELECTRICAL CIRCUIT

Filed Nov. 27, 1967 2 Sheets-Sheet 1

Inventors:
Werner Bachnick &
Rolf Wegener
BY Spencer & Kaye
ATTORNEYS

Inventors:
Werner Bachnick &
Rolf Wegener
BY Spencer & Kaye
ATTORNEYS

United States Patent Office 3,553,600

Patented Jan. 5, 1971

3,553,600

ELECTRICAL CIRCUIT

Werner Bachnick, Bredenbeck, Hannover, and Rolf Wegener, Hannover, Germany, assignors to Telefunken Patentverwertungsgesellschaft m.b.H., Ulm (Danube), Germany Filed Nov. 27, 1967, Ser. No. 685,778

Claims priority, application Germany, Dec. 2, 1966, T 32,655

Int. Cl. H03f *3/00, 3/60*

U.S. Cl. 330—66 9 Claims

ABSTRACT OF THE DISCLOSURE

The present invention relates to a high frequency amplifier arrangement with several resonant-line circuits (e.g. television tuner) where the inner conductors and the outer conductors of the resonant-line circuits are arranged on a metal coated carrier plate, the inner conductors being arranged one behind the other and resting with its ends on a side edge of said carrier plate, which is inserted in an amplifier base plate. The base plate, which carries the relevant circuit elements and if necessary other amplifier stages, is dip soldered with the inserted carrier plate. Two ends of two inner conductors facing one another may be grounded by a common inductance consisting of two conductors coupled with one another, whereas the other ends of the two inner conductors are grounded across a tuning capacitance.

The present invention relates to a high frequency amplifier arrangement.

It is known that high frequency amplifiers can be carried out by strip line technology, several inner conductors being arranged on a common base plate, together with other circuit elements dip soldered on the base plate. In practise however this strip line technology could not succeed in domestic sets because the dielectric employed for forming the resonant-line circuits is very expensive.

SUMMARY OF THE INVENTION

It is an object of the invention to provide a high frequency amplifier making full use of the advantages of printed circuit technology, such as dip soldering, common manufacturing of the base plate and the resonant-line circuits etc., while at the same time making possible an inexpensive application of the strip line technology.

A second object of the present invention is to arrange resonant-line circuits in such a manner on a very high-grade carrier plate that those resonant-line circuits being coupled for example to a band-pass filter are to be connected easily.

A further object of the present invention is to use a base plate of relatively simple design with only single-sided metal coating and inexpensive dielectric.

These objects and others ancillary thereto are accomplished in accordance with a preferred embodiment of the invention wherein there is provided a high frequency amplifier arrangement comprising in combination:

(a) At least two resonant-line circuits the conductors of which are arranged in accordance with strip line technique.

(b) A carrier plate of dielectric material common to said resonant-line circuits and carrying said conductors.

(c) Conductive layers disposed on said carrier plate and forming said conductors.

(d) At least one of said conductors of each resonant-line circuit being formed so that its ends are ending at one edge of said carrier plate.

(e) A base plate of insulating material carrying the relevant circuit elements of said resonant-line circuits.

(f) Means for fixing said edge of said carrier plate on said base plate and connecting said ends of said conductors to said circuit elements.

BRIEF DESCRIPTION OF THE DRAWINGS

Additional objects and advantages of the present invention will become apparent upon consideration of the following description when taken in conjunction with the accompanying drawings in which.

DESCRIPTION OF THE PREFERRED EMBODIMENTS

Figure 1:
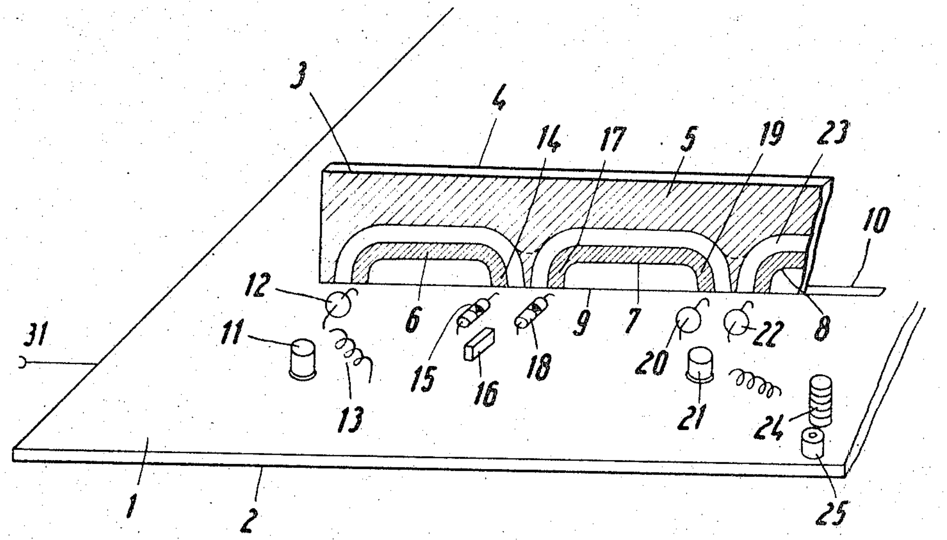
FIG. 1 is the spatial representation of an high frequency amplifier with the characteristics of the invention.

Referring to the drawings and, more particularly, to FIG. 1, the high frequency amplifier is arranged on a base plate 1, which is provided on the lower part in the drawing with a metal coating 2. In the base plate 1 there is inserted in a slit 10 a carrier plate 3, which is provided on the side facing away with a continuous metal coating 4, and on the side facing the observer with a metal coating 5, from which inner conductors 6, 7, 8 for a UHF band-pass filter and an oscillator circuit are cut out. The outer conductors are represented mainly by said metal coating 4 and in part by the metal coating 5 forming together with said inner conductors 6, 7, 8 resonant line circuits according to the principle of strip line technology. The metal coating 4 serves also for screening the individual resonant-line circuits from one another and from outside. The inner conductors 6, 7, 8 are cut out of the metal coating 5 forming curves in such a way that said curves lie one behind the other in the longitudinal direction of the carrier plate 3. The ends of said curved inner conductors 6, 7, 8 end at a side edge 9 of the carrier plate 3. Except the inner conductors 6, 7, 8 the metal coating 5 is not essential for the forming of the resonant-line circuits and may be taken away. With said side edge 9 the carrier plate 3 is inserted in said slit 10 in said base plate 1 and is soldered to the metal coating 2. The base plate 1 consists of a rather inexpensive, insulating material in which the resistances, capacities and other elements of the amplifier are inserted, as is normally done in the case of printed circuits. The carrier plate 3 on the other hand consists of a relatively high-grade dielectric material, e.g. a polytetrafluorethylene or a material consisting of glass fibres with a filling compound. The inner conductors 6, 7, 8 are in each case arranged in such a way that the signals are fed into the left end and tapped at the right hand end. In FIG. 1 the connecting leads of the whole amplifier are arranged on the lower side 2 of the base plate 1, so that only the elements of the circuits are visible on the side 1 facing the observer. Their connections are soldered to the leads on the lower side 2 of the base plate 1.

The signals pass from an input 31 to a preamplifier transistor 11 and a condenser 12 and further to the inner conductor 6 of the first resonant-line circuit. A choke 13 serves to pass the voltage supply for the transistor 11. The lower end 14 of the inner conductor 6 is connected on the lower side 2 of the base plate 1 with one end of a capacity diode 15; the other end is connected on the lower side 2 of the base plate 1 with a coating of a small conductor plate 16, which is metal coated on two sides and soldered with ground on the lower side 2 of the base plate 1. The other side of the small conductor plate 16 is connected to the free electrode of a capacity diode 18, which is connected with the end 17 of the inner conductor 7. The two ends of the capacity diodes 15 and 18 are connected to the coatings of the small conductor plate 16 in such a way that the two coatings of this small plate act as inductances between the connection of the capacity diodes and the ground connection, which are coupled together across the insulating material part of the small plate. The small conductor plate 16 therefore acts as basepoint coupling for the two inner conductors 6 and 7. The lower end 19 of the inner conductor 7 is connected across a condenser 20 with an electrode of a transistor 21, which is connected as converter. Another electrode of the transistor 21 is connected across a condenser 22 to the end 23 of the inner conductor 8 of said oscillator circuit. In the output circuit of this stage there is arranged inter alia the intermediate frequency amplifier stage, whose coil 24 may be seen on the upper side 1 of the base plate 1. 25 is a bushing for tapping the intermediate frequency.

The carrier plate 3 serves not only as support for the resonant line circuits, but also as screen between the elements facing the observer and the amplifier parts arranged behind the carrier plate 3 which are intended for quite a different frequency band. If, for instance, the circuit elements are suitable for bands IV and V, the elements arranged on the back of the carrier plate 3 can be operated in bands I and II. For screening the amplifier parts of bands I, III, IV and V from amplifiers of further frequency bands, e.g. of the IF amplifiers or the video-amplifiers etc, which are likewise arranged on the same base plate 1. The circuit elements assigned to the high frequency bands can be covered by a further screen which can be inserted in slits in the base plate 1.

The tuned circuits of the arrangement shown in FIG. 1 are of rather low impedance. By tuning these circuits with capacity diodes it has been found difficult to cover the desired frequency band, because the dielectric and the dimensions of the conductors cannot fall below certain dimensions for mechanical and electrical reasons. This difficulty is overcome by the fact that a circuit according to FIG. 2 is used with capacity transformation.

Figure 2:
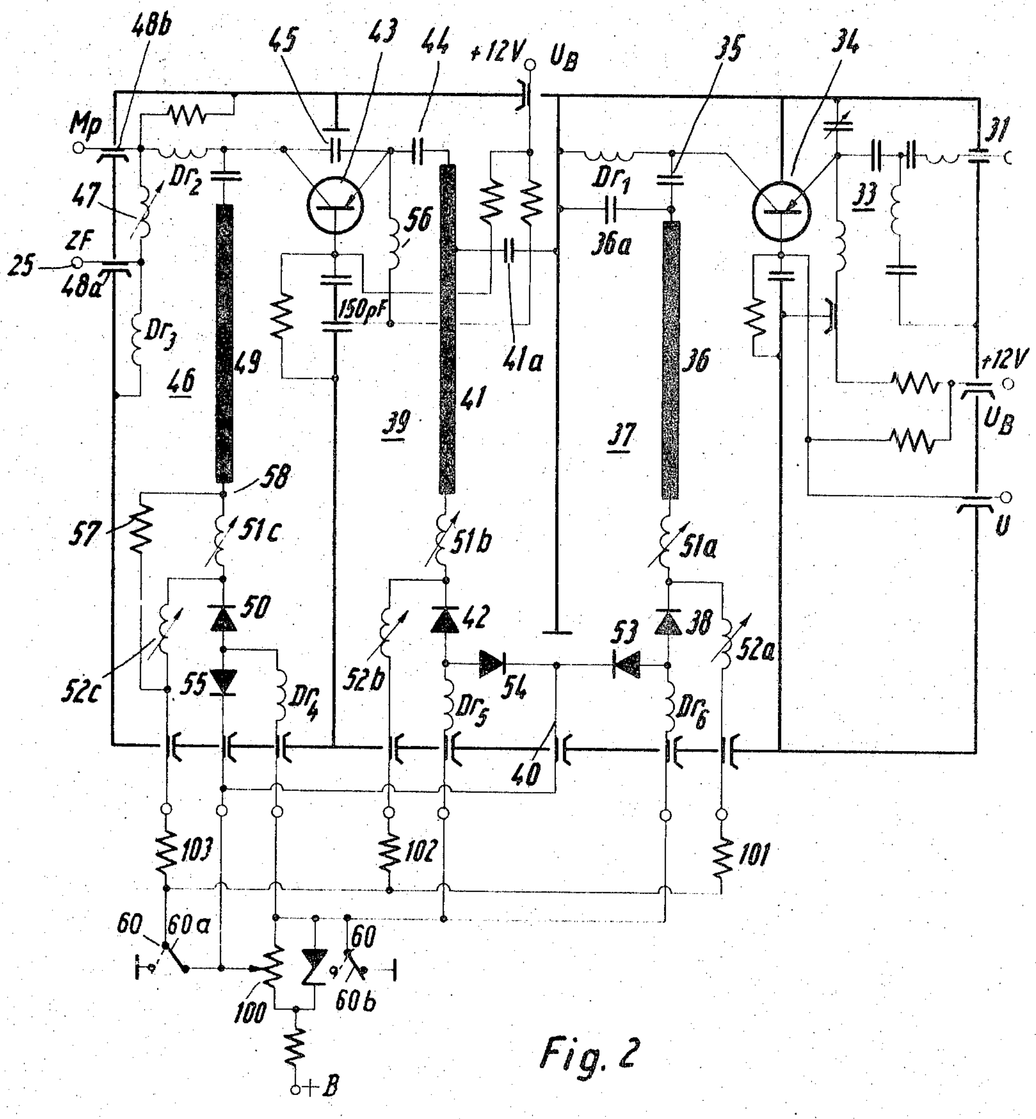
FIG. 2 shows an electrical schematic diagram of an UHF-part of a television set making use of the amplifier represented in FIG. 1.

FIG. 2 shows a circuit of a UHF part with an amplifier represented in FIG. 1. The high frequency signals are passed at an input 31 to an input high-pass filter 33 and come to the emitter electrode of a transistor 34 operated in base circuit. The collector electrode is connected across a coupling condenser 35 with an inner conductor 36 and a condenser **36*a* of a high frequency circuit 37, which for tuning is grounded across capacity diodes 38 and 53. The circuit 37 is coupled with a secondary circuit 39 across the inductance of a conductor 40 common to both circuits 37 and 39, which is formed in FIG. 1 by the small conductor plate 16. Both circuits 37, 39 are connected as band-pass filters, the inner conductor 41 of the secondary circuit 39 being grounded across capacity diodes 42 and 54. The secondary circuit 39 is connected to the emitter of a transistor 43 across a coupling condenser 44. The transistor 43 is the active element of a converter, in which a condenser 45 forms a feedback for an oscillator frequency of an oscillator line circuit 46. The oscillator circuit 46 is connected by a choke $Dr_2$ in the capacitive branch of an IF band-pass filter, formed by bypass capacitors 48*a* and 48*b* and an inductance 47. A further choke $Dr_3$ connects the DC path of the transistor 43 to ground. The IF output signals are tapped at a terminal 25. The inner conductor 49 of the oscillator line circuit 46 is grounded across capacity diodes 50 and 55. In series with the capacity diodes 38, 42 and 50 there are connected inductances 51*a***, *b*, *c*. The impedance consisting of the additional inductances, the inner inductance of the diodes 38, 42 or 50 and other elements between the inner conductors 36, 41 and 49 and ground is dimensioned so that its series resonant frequency, on a variation of the capacity of the respective tuned and loaded line circuit, is at the lower frequency limit below and at the upper frequency limit above the resonant frequency of the tuned line circuit. For obtaining and adjusting a better synchronization, the value of the inductances in the line circuits may be made different. By means of further inductances **52*a***, *b*, *c* connected in parallel with the capacity diodes 38, 42 and 50 the frequency band of the circuits is increased. A still greater frequency band can be be covered if the capacity diodes 53, 54 and 55, assigned to the capacity diodes 38, 42, 50 can be switched over, so that either only one or both capacity diodes 38 and 53; 42 and 54; 50 and 55 can be varied in capacity. A switch 60 for switching over the capacity diodes 53, 54, 55 has two poles **60*a* and 60*b***.

A tuning voltage +B, variable by a potentiometer 100, is supplied to the capacity diodes across resistors 101, 102, 103, by pass capacitors and chokes D*r*4, D*r*5, D*r*6. The relative position of the series resonances is, for instance, obtained by the fact that in the case of one diode this has a relatively great capacity lift and in the case of both diodes, these have correspondingly different capacity values. A tendency to oscillation of the first stage with the transistor 34 at a frequency which is furnished by the impedance 38, **51*a*, 52*a*, 53 is prevented by the input high-pass filter 33 which forms approximately a short-circuit for this frequency. In the stage 43 a choke 56, which for control with signals must have a higher value, could bring about an oscillation with the parallel resonant frequency of the impedance 50, 51*c*, 52*c*, 55. This is avoided by a loss resistance 57 in parallel with the impedance. One connecting point of the loss resistance 57 is selected so that it corresponds to a nodal point of the frequency at which the impedance is in series resonance. In this way the resistance 57 linearises at the same time the amplitude characteristic. Good results are also obtained if the connecting point lies between the connecting point 58 of the inner conductor 49 and the inductance 51*c*** on the one hand and the nodal point that corresponds to the maximum oscillator frequency on the other hand.

What is claimed is:

1. An arrangement for use with a high frequency amplifier comprising, in combination:

(a) a carrier plate of dielectric material having conductive layers disposed on its opposite sides;

(b) a plurality of stripline type resonant line circuits formed by said conductive layers, a first conductor of each resonant line circuit being formed from one of said conductive layers and the other conductor of each resonant line circuit being formed from the other of said conductive layers;

(c) at least said first of said conductors of each resonant line circuit being formed so that its ends terminate at one edge of said carrier plate;

(d) said conductors which have their ends terminating at said one edge of said carrier plate being arranged one behind the other in a longitudinal direction along said edges;

(e) a base plate of insulating material having a slit formed therein;

(f) said carrier plate having said one edge inserted in said slit;

(g) a conductive layer on said base plate constituting a printed circuit;

(h) circuit elements soldered on said base plate to said printed circuit; and (i) means connecting said ends of said conductors on the carrier plate to said printed circuit on the base plate.

2. A high frequency amplifier arrangement according to claim 1 wherein said base plate carries a printed wiring on at least one side dip soldered with said circuit elements and with said carrier plate.

3. A high frequency amplifier arrangement according to claim 1 wherein the ends of two of said conductors ending at said edge of said carrier plate and adjacent one another are grounded via a common inductance provided on said base plate.

4. A high frequency amplifier arrangement according to claim 3 wherein the opposite ends of said conductors are grounded via a tuning capacitance.

5. A high frequency amplifier arrangement according to claim 3 wherein said common inductance consists of two conductors coupled with one another.

6. A high frequency amplifier arrangement according to claim 1 wherein said carrier plate is coated at one side with a continuous metal layer providing one of the conductors of all resonant-line circuits.

7. An arrangement for use with a high frequency amplifier as in claim 1 including circuits screened by said carrier plate arranged on said base plate.

8. A circuit for use with a high-frequency amplifier as defined in claim 1 wherein said conductors are bent and have a central portion between said ends which is spaced from said edge of the carrier plate.

9. A high frequency amplifier arrangement as defined in claim 6 wherein all of said circuit components functionally connected to said resonant line circuits are adjacent to the side of said carrier plate not having said continuous conductive coating, whereby said continuous conductive coating acts as a screen for any additional circuits adjacent thereto on said base plate.

References Cited

UNITED STATES PATENTS

| | | | |
|---|---|---|---|
| 2,777,039 | 1/1957 | Thias | 317—101X |
| 3,177,315 | 4/1965 | Clare | 317—101X |
| 3,335,327 | 8/1967 | Damon et al. | 317—101 |

FOREIGN PATENTS

| | | | |
|---|---|---|---|
| 1,197,518 | 7/1965 | Germany | 330—66 |

NATHAN KAUFMAN, Primary Examiner

U.S. Cl. X.R.

330—16, 24, 38